United States Patent [19]

Nozue

[11] Patent Number: 5,439,765
[45] Date of Patent: Aug. 8, 1995

[54] PHOTOMASK FOR SEMICONDUCTOR INTEGRATED CIRCUIT DEVICE

[75] Inventor: Hiroshi Nozue, Tokyo, Japan
[73] Assignee: NEC Corporation, Japan
[21] Appl. No.: 291,835
[22] Filed: Aug. 17, 1994

Related U.S. Application Data

[62] Division of Ser. No. 38,608, Mar. 29, 1993, abandoned.

[30] Foreign Application Priority Data

Apr. 2, 1992 [JP] Japan .................................. 4-080739

[51] Int. Cl.$^6$ ................................................ G03F 9/00
[52] U.S. Cl. .......................................... 430/5; 430/22; 430/321
[58] Field of Search ............................. 430/5, 22, 321

[56] References Cited

PUBLICATIONS

"Silicon Processing for the VLSI ERA", Lithography II: Optical Alignment Tools and Photomasks, pp. 476–489.

*Primary Examiner*—S. Rosasco
*Attorney, Agent, or Firm*—Laff, Whitesel, Conte & Saret, Ltd.

[57] ABSTRACT

In making semiconductor patterns on a glass substrate by a light shielding substance such as chromium (Cr), the amount of necessary data and time to make the semiconductor patterns can be reduced. Patterns each having a size smaller in at least one direction than the resolution limit of an exposure device are previously arranged on the glass substrate at regular intervals smaller than the resolution limit and they are partially removed in accordance with the patterns for a semiconductor integrated circuit. Thus, a photomask can be provided for the semiconductor integrated circuit.

5 Claims, 5 Drawing Sheets

PHOTOMASK FOR SEMICONDUCTOR INTEGRATED CIRCUIT DEVICE

This application is a division of application Ser. No. 08/038,608 filed Mar. 29, 1993, now abandoned.

BACKGROUND OF THE INVENTION (1) Field of the Invention

The present invention relates to a photomask used in exposing photoresist applied to a semiconductor substrate to ultraviolet rays.

(2) Description of the Related Art

In recent years, with the development of semiconductor technology, high-performance and low-price semiconductor devices have been mass-produced. Correspondingly, performance improvement and price reduction in electronic equipment using semiconductor devices, such as general purpose computers, personal computers, personal telephones and television game devices, have been greatly advanced. In order to distinguish one from others in terms of performance in these products, the products each provided with several kinds of unique functions have competitively been made available to customers. In this case, it is difficult to achieve a unique function using only general purpose semiconductor devices. So, in the fabrication of the semiconductor devices, custom LSIs with unique functions are required. The custom LSIs include a semi-custom LSI called a "gate array" which is fabricated up to an intermediate step of process in a general way and modified in various ways in a wiring step. The gate array is inexpensive, and can be fabricated in a relatively short time because it has only to be uniquely designed in the wiring step. For this reason, in recent years, the gate arrays have been mass-produced.

Formation of wirings for the gate array is effected in such a way that, after a wiring pattern is designed, the wiring pattern made of metal such as chromium (Cr) formed on a glass substrate, which is called a mask or a reticle, is transferred on to a semiconductor substrate by an exposure device called a stepper. FIGS. 1A through 1D are longitudinal sectional views for explaining a conventional reticle and a method of making the reticle. In making the reticle, first, an electron beam resist is applied to a glass substrate 1 covered with a chromium (Cr) film 2. In accordance with design data for a reticle pattern, an electron beam exposure system writes the pattern using electron beams 4 as shown in FIG. 1A. The electron beam resist 3 is developed as shown in FIG. 1B and, then, using the resultant electron beam resist 3 as a mask, the chromium (Cr) film 2 is etched away as shown in FIG. 1C. Finally, the electron beam resist 3 is removed to thereby complete a reticle as shown in FIG. 1D. FIG. 2A is a partial plan view of the completed reticle, and FIG. 2B is a sectional view taken along the line A-A' in FIG. 2A. The wiring pattern is formed by the chromium (Cr) film 2.

The above prior art has the following problems to be solved. In the prior art, in order to make a reticle, first, it is necessary to convert design data for a reticle pattern into a data format which is peculiar to the electron beam exposure system used. This requires a very long time for conversion and a great expense for using a computer. Further, in the pattern writing using the electron beam exposure system, the writing time increases substantially in proportion to the increase in the number or area of reticle patterns. Thus, with the advancement in the large-scaling of LSIs in recent years, the writing time is rapidly increasing and many hours, for example, 24 hours are spent only for the data conversion and the pattern writing. In this way, using the conventional reticle presents a problem in that it takes a long time and is costly to fabricate a custom LSI which is expected to be or should be supplied in a short time and at low cost. These are problems to be solved by the invention, in the conventional photomasks for the semiconductor integrated circuit devices.

SUMMARY OF THE INVENTION

It is, therefore, an object of the present invention to provide a photomask which permits a semiconductor device to be fabricated in a short time and at low cost.

According to one aspect of the invention, there is provided a photomask for a semiconductor integrated circuit device in which patterns for a semiconductor integrated circuit are formed by a light shielding substance on a glass substrate, wherein the patterns are formed by a predetermined number out of a plurality of minute light shielding patterns each of which has a size smaller in at least one direction than a resolution limit of an exposure device and which are arranged on an entire surface of the glass substrate at regular intervals smaller than the resolution limit, with remainders of the plurality of the minute light shielding patterns being removed in accordance with the patterns for the semiconductor integrated circuit.

DESCRIPTION OF THE PREFERRED EMBODIMENTS

Now, referring to the accompanying drawings, embodiments of the present invention will be explained below.

Figure 1A:
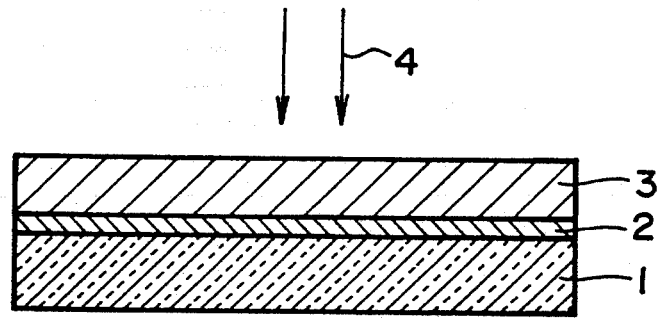
FIGS. 1A to 1D are sectional views for explaining the prior art.
Figure 1B:
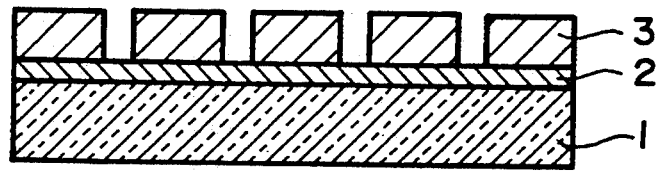
Figure 1C:
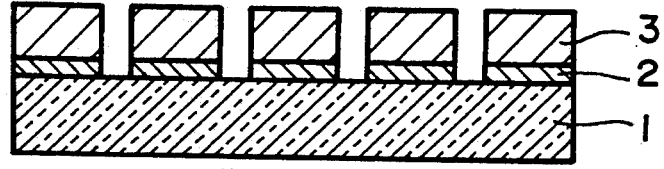
Figure 1D:
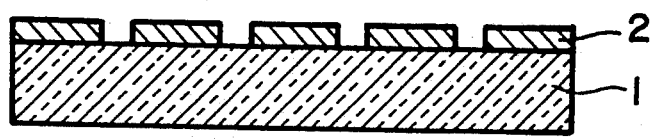
Figure 2A:
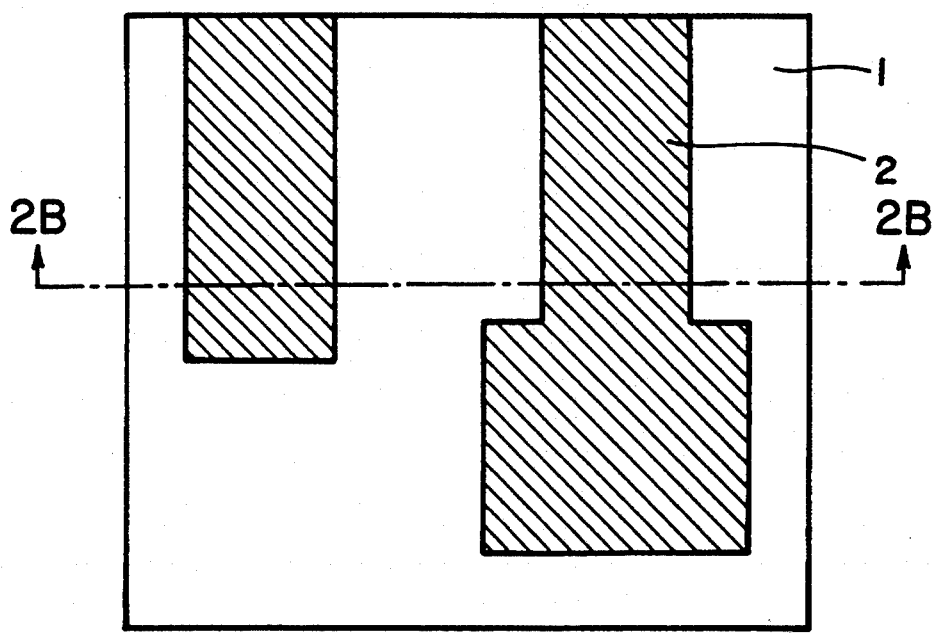
FIGS. 2A and 2B are plan view and sectional view, respectively, of the prior art, FIG. 2B being taken along line 2B—2B of FIG. 2A.
Figure 2B:
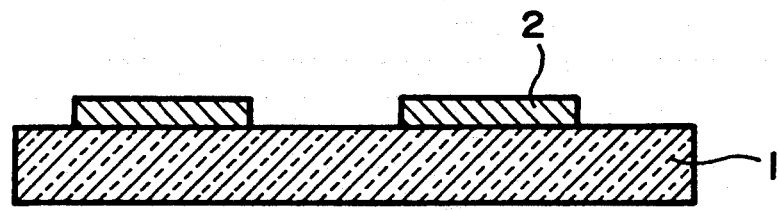
Figure 3A:
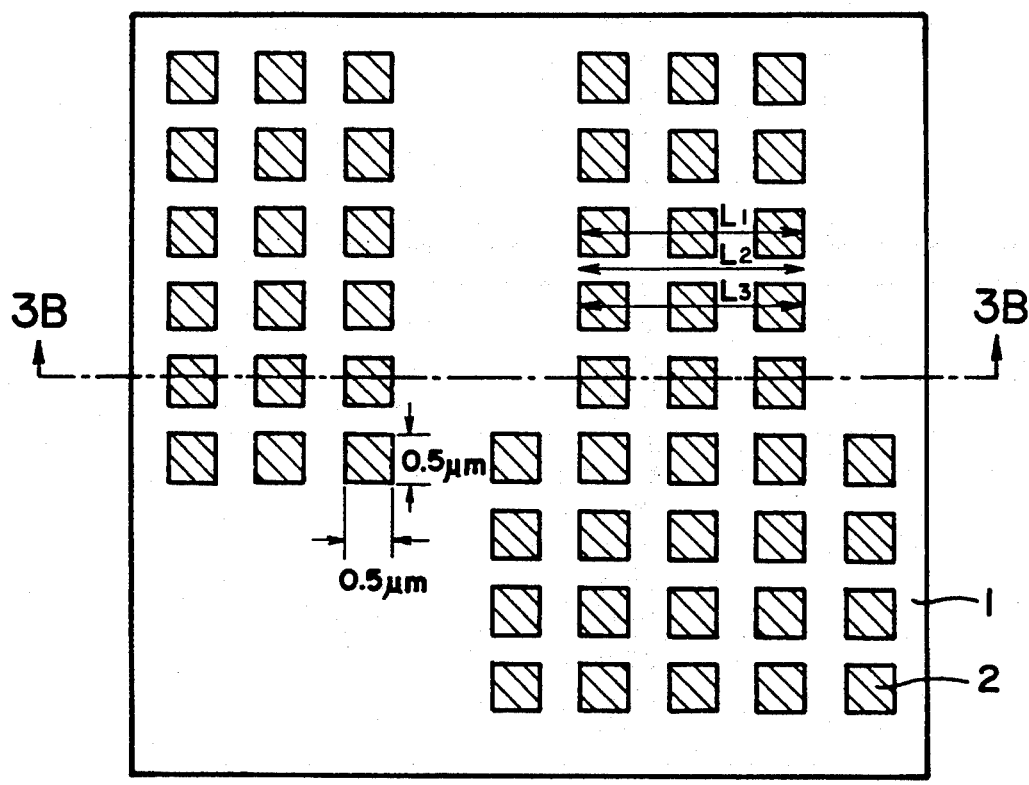
FIGS. 3A and 3B are plan view and sectional view, respectively, of a first embodiment according to the present invention, FIG. 3B being taken along line 3B—3B in FIG. 3A.
Figure 3B:
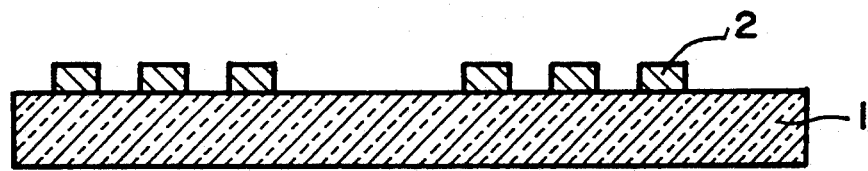

FIG. 3A is a plan view of the first embodiment of the present invention, and FIG. 3B is a sectional view taken along the line B-B' shown in FIG. 3A. As shown in FIG. 3A, a number of chromium (Cr) light shielding patterns 2 each having a size not permitting the resolution by means of an exposure device are arranged on a glass substrate 1 at regular interval's not permitting the resolution by the exposure device. Now, the size not permitting the resolution by the exposure device means 0.3 $\mu$m or less in a 1/5 reduction stepper as an exposure device which used i-beams of a mercury lamp and has a reduction projection lens of NA =0.50–0.54. Since the stepper reduces the pattern on a reticle to 1/5 on the wafer, the resolution limit of 0.3 μm corresponds to 1.5 μm on the reticle. In this embodiment, each of the used minute chromium (Cr) patterns 2 is a square of 0.5 by 0.5 μm and the interval therebetween is set for 0.5 μm. The minute chromium (Cr) patterns shown in FIG. 3A are remainders after the unnecessary portions of the minute chromium (Cr) patterns formed on the entire surface of the glass substrate 1 are partially removed in accordance with the pattern data. FIG. 3B is a sectional view taken along the line B-B' shown in FIG. 3A.

Figure 4:
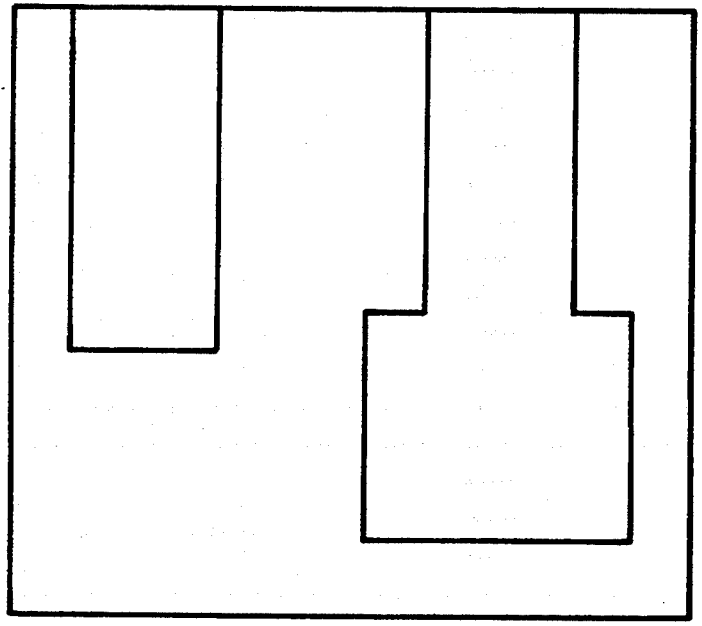
FIG. 4 is a view showing a pattern data for explaining the present invention.
Figure 5:
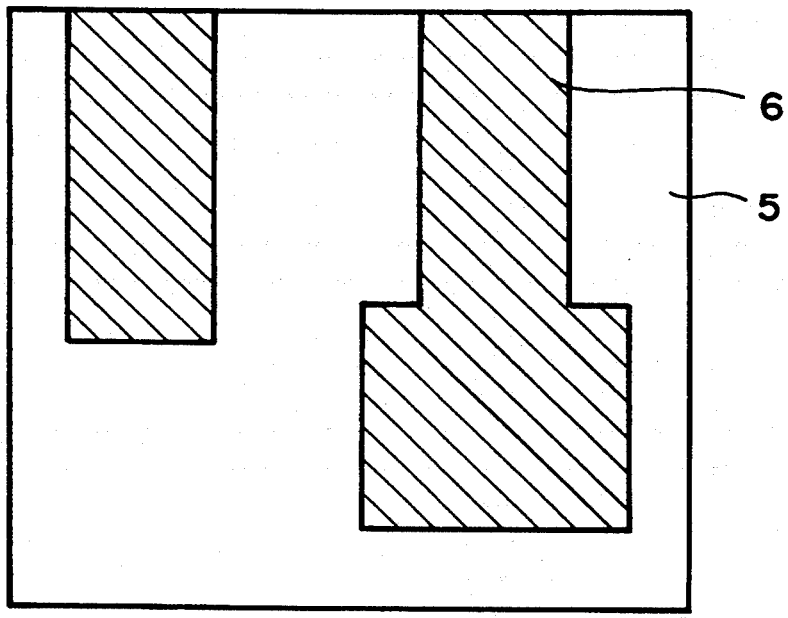
FIG. 5 is a view showing a positive resist pattern for explaining the present invention.

FIG. 4 shows a part of the pattern data. FIG. 5 shows a positive resist pattern 6 formed when exposed on a semiconductor substrate 5 using the reticle according to this embodiment. Exposure light is hardly likely to pass through the portion where the minute chromium (Cr) patterns are regularly arranged so that the corresponding area is not exposed on the semiconductor substrate 5. On the other hand, exposure light does pass through the portion where the minute chromium (Cr) patterns 2 are removed so that the Cr-free area larger than the resolution limit is formed. Positive resist on the corresponding area is exposed on the semiconductor substrate 5 to thereby form the positive resist pattern as shown in FIG. 5. In making the reticle according to this embodiment, the glass substrate on the entire surface of which are formed in advance the minute chromium (Cr) patterns 2 is used. The portion to be removed is determined in accordance with the pattern data.

Figure 6A:
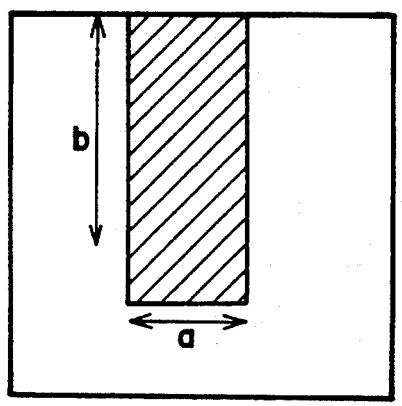
FIGS. 6A and 6B are plan view and sectional view, respectively, for explaining the difference between the present invention and the prior art.
Figure 6B:
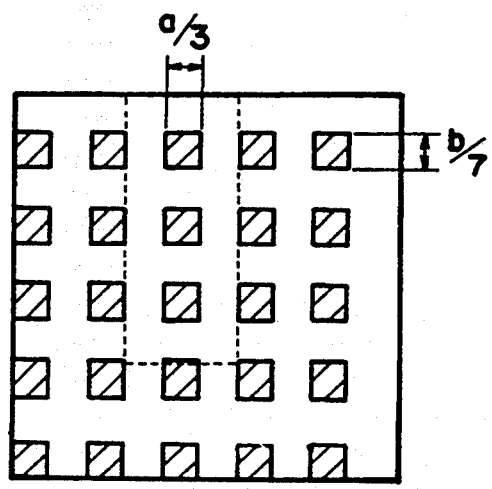

FIGS. 6A and 6B are plan views for explaining a difference between the electron beam exposure area in the conventional reticle and that in the reticle according to this embodiment. In the prior art technique, in order to form an objective pattern, a writing area of a×b as shown in FIG. 6A is required because chromium (Cr) lies on the entire surface of the glass substrate. In this case, the corresponding writing area required in this embodiment may be only 1/7 (××3=) as compared to that in the prior art technique because chromium (Cr) partially lies on the substrate surface as seen from FIG. 6B. Thus, the electron beam writing area for making a reticle can be decreased to about 1/7 and so the data amount to be processed can also be reduced to about 1/7. This permits the reticle to be made in a short time and at low cost.

Figure 7:
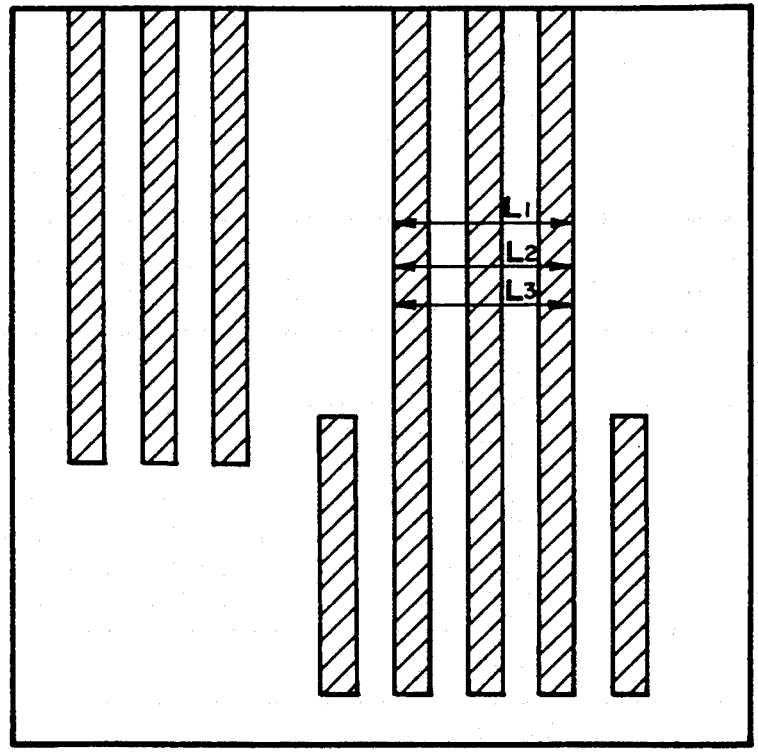
FIG. 7 is a plan view of a second embodiment according to the present invention.

FIG. 7 is a plan view of the reticle pattern according to the second embodiment of the present invention. In this embodiment, as seen from FIG. 7, long stripe patterns each having a width of 0.5 μm which is shorter than the resolution limit of the exposure device are formed in only one direction at regular intervals of 0.5 μm. In order to obtain the same pattern as In the first embodiment, the chromium (Cr) film 2 is partially removed. In this embodiment, the amount of necessary data and the area of writing are slightly larger than in the first embodiment. But, this embodiment is further enhanced than the first embodiment in dimension controllability since the dimension can be always defined by the edges of the chromium (Cr) pattern as $L_1=L_2=L_3$ in the portions indicated by $L_1$, $L_2$ and $L_3$ in FIG. 3A and FIG. 7.

As described above, in accordance with the present invention, a reticle can be provided in which patterns each having a smaller size than the resolution limit of an exposure device are arranged on a glass substrate at regular intervals smaller than the resolution limit and they are partially removed in accordance with the pattern for a semiconductor integrated circuit. Thus, the time and cost involved in making the reticle can be reduced. This permits a semiconductor device to be fabricated in a short time and at low cost using such a reticle.

It is to be noted that the reticle or photomask according to the present invention can be applied to other semiconductor devices such as memory and a microcomputer as well as the gate array.

Further, the photomask according to the present invention, can be applied to not only exposure by the 1/5 reduction stepper described above but also exposure by a stepper with other reduction ratios such as ¼ or intact exposure of 1/1.

Further, the patterns which are smaller than the resolution limit of an exposure device may be removed by the means such as light exposure or laser trimmer other than the electron beam exposure.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method of making a photomask for a semiconductor integrated circuit device, in which a circuit pattern to be transferred onto a wafer of a semiconductor integrated circuit is formed by a light shielding substance on a glass substrate, said method comprising the steps of:

forming on said glass substrate a plurality of minute light shielding patterns, each of said plurality of patterns being a size which is smaller in at least one direction than a limit of a resolving power of an exposure device, said plurality of patterns being arranged at regular spaces on an entire surface of said glass substrate, said regular spaces being smaller than the limit of the resolving power of said exposure device, and said patterns being produced responsive basically to only one kind of data and said photomask being mass-produced in advance; and partially removing said minute light shielding patterns so that said circuitry pattern which is to be transferred onto the wafer is formed by remainders of the plurality of said minute light shielding patterns.

2. The method of making a photomask according to claim 1, wherein said light shielding substance forming said minute light shielding patterns is made from chromium (Cr).

3. The method for making a photomask according to claim 1, wherein each of said minute light shielding patterns is formed in a square configuration and said minute light shielding patterns are arranged in a matrix form with an interval which is smaller than the limit of the resolving power of said exposure device, said interval being provided between adjacent minute light shielding patterns at each of four sides of said minute patterns.

4. The method of making a photomask according to claim 1, wherein each of said minute light shielding patterns is formed in a stripe configuration having a width which is smaller than the limit of the resolving power of said exposure device and said minute light shielding patterns are arranged with an interval which is smaller than the limit of the resolving power of said exposure device, the interval being provided between adjacent light shielding patterns at longitudinal sides of the patterns.

5. The method of making a photomask according to claim 1, wherein said minute light shielding patterns are partially removed by an electron beam exposure method.

* * * * *